United States Patent
Tredwell et al.

(10) Patent No.: US 8,674,468 B2
(45) Date of Patent: Mar. 18, 2014

(54) IMAGING ARRAY WITH DUAL HEIGHT SEMICONDUCTOR AND METHOD OF MAKING SAME

(75) Inventors: Timothy J. Tredwell, Fairport, NY (US); Jackson Lai, Rochester, NY (US)

(73) Assignee: Carestream Health, Inc., Rochester, NY (US)

( * ) Notice: Subject to any disclaimer, the term of this patent is extended or adjusted under 35 U.S.C. 154(b) by 144 days.

(21) Appl. No.: 12/474,332

(22) Filed: May 29, 2009

(65) Prior Publication Data

US 2010/0301443 A1    Dec. 2, 2010

(51) Int. Cl.
*H01L 31/10*    (2006.01)
*H01L 31/18*    (2006.01)

(52) U.S. Cl.
USPC .......... 257/443; 257/431; 257/E27.132; 257/E27.133; 257/350; 257/347

(58) Field of Classification Search
USPC .......... 257/431, E27.13, E27.132, E27.133, 257/443, 350, 347, 59, 56
See application file for complete search history.

(56) References Cited

U.S. PATENT DOCUMENTS

| | | | |
|---|---|---|---|
| 4,847,210 A | 7/1989 | Hwang et al. | |
| 5,414,276 A | 5/1995 | McCarthy | |
| 5,430,298 A * | 7/1995 | Possin et al. | 250/370.11 |
| 5,463,238 A * | 10/1995 | Takahashi et al. | 257/351 |
| 5,488,012 A | 1/1996 | McCarthy | |
| 6,465,846 B1 * | 10/2002 | Osanai | 257/347 |
| 6,583,030 B1 | 6/2003 | Grassi | |
| 6,610,582 B1 | 8/2003 | Stewart | |
| 6,649,977 B1 | 11/2003 | McCarthy | |
| 6,759,282 B2 | 7/2004 | Campbell et al. | |
| 6,921,961 B2 | 7/2005 | Sanchez et al. | |
| 7,075,501 B1 | 7/2006 | Spitzer et al. | |
| 7,122,442 B2 | 10/2006 | Cleavelin | |
| 7,176,528 B2 | 2/2007 | Couillard et al. | |
| 7,192,844 B2 | 3/2007 | Couillard et al. | |
| 7,208,810 B2 * | 4/2007 | Wright | 257/444 |
| 7,268,051 B2 | 9/2007 | Couillard et al. | |
| 7,285,477 B1 | 10/2007 | Bernstein et al. | |
| 7,948,017 B2 | 5/2011 | Tredwell et al. | |
| 2004/0061176 A1 * | 4/2004 | Takafuji et al. | 257/347 |
| 2005/0205930 A1 | 9/2005 | Williams, Jr. | |
| 2009/0065681 A1 | 3/2009 | Iwabuchi et al. | |
| 2009/0186464 A1 | 7/2009 | Morimoto et al. | |
| 2011/0147602 A1 | 6/2011 | Ishida et al. | |

* cited by examiner

*Primary Examiner* — Cathy N Lam

(57) ABSTRACT

A method of fabricating an imaging array includes providing a single crystal silicon substrate and bonding the single crystal silicon substrate to an insulating substrate. One or more portions of an exposed surface of the single-crystal silicon substrate are removed to form a pattern of first areas having a first height measured from the insulating substrate and second areas having a second height measured from the insulating substrate. Photosensitive elements are formed on the first areas and readout elements are formed on the second areas. The single-crystal silicon substrate is treated by hydrogen implantation to form an internal separation boundary and a portion of the single-crystal silicon substrate is removed at the internal separation boundary to form the exposed surface.

18 Claims, 15 Drawing Sheets

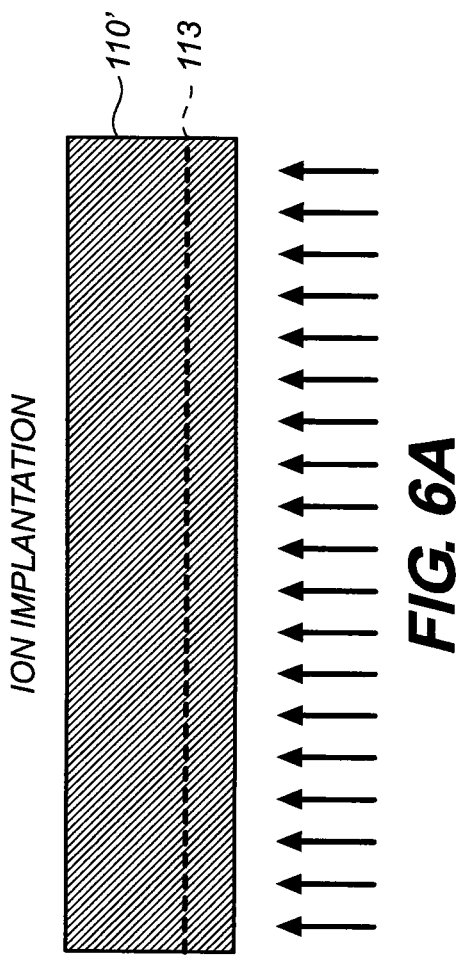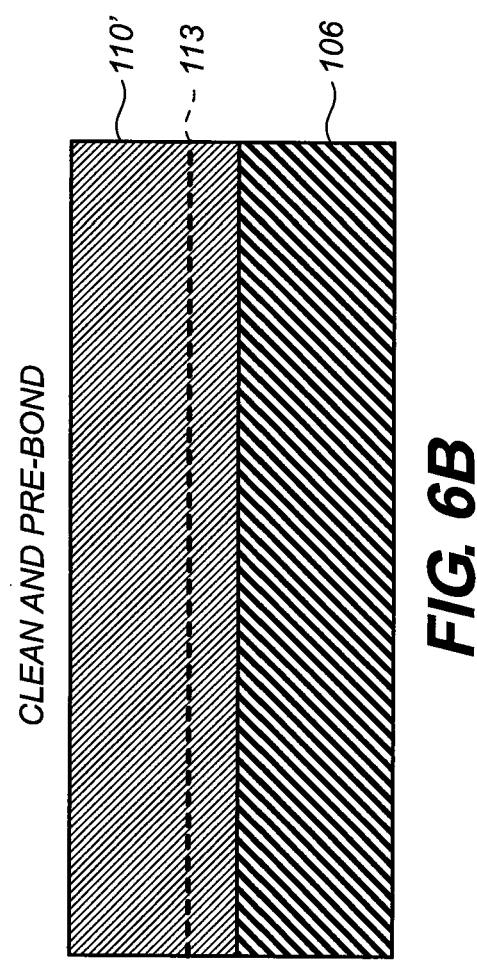

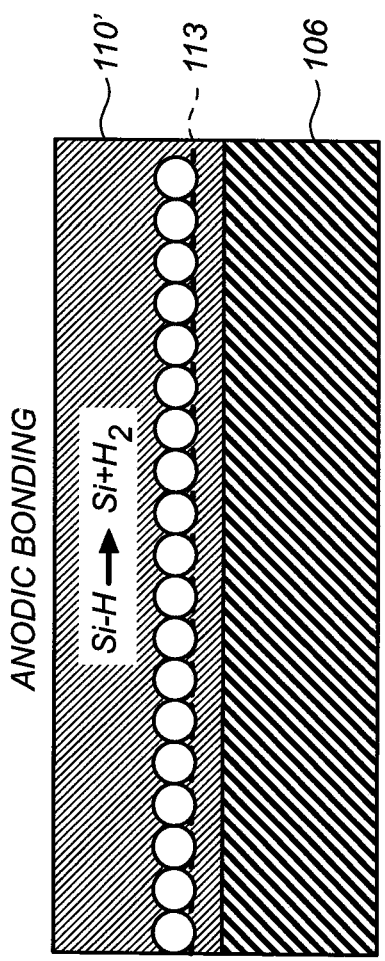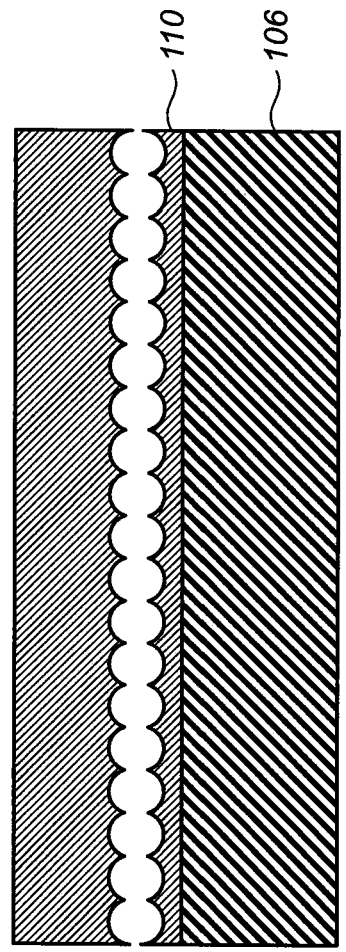

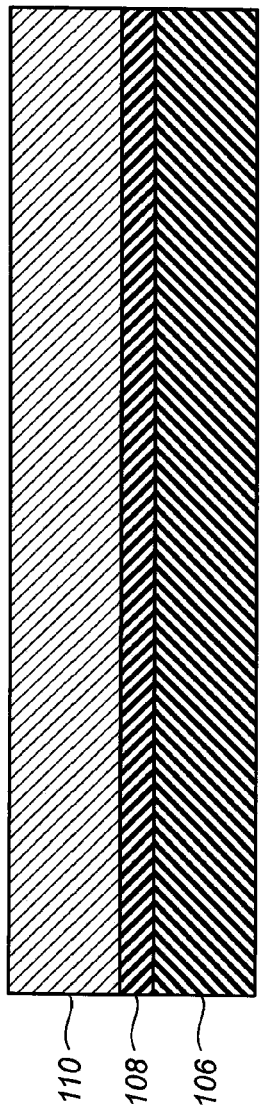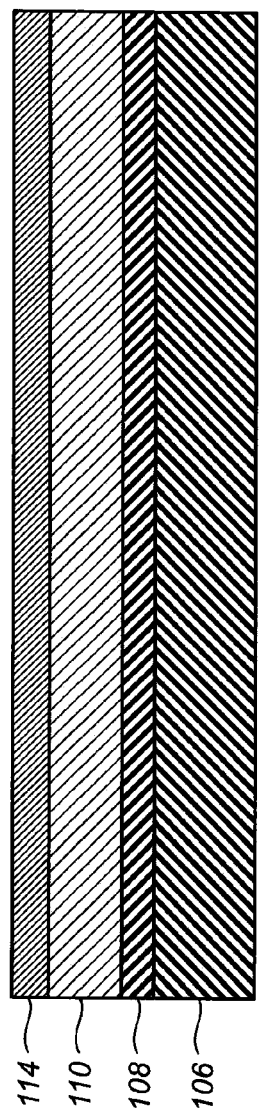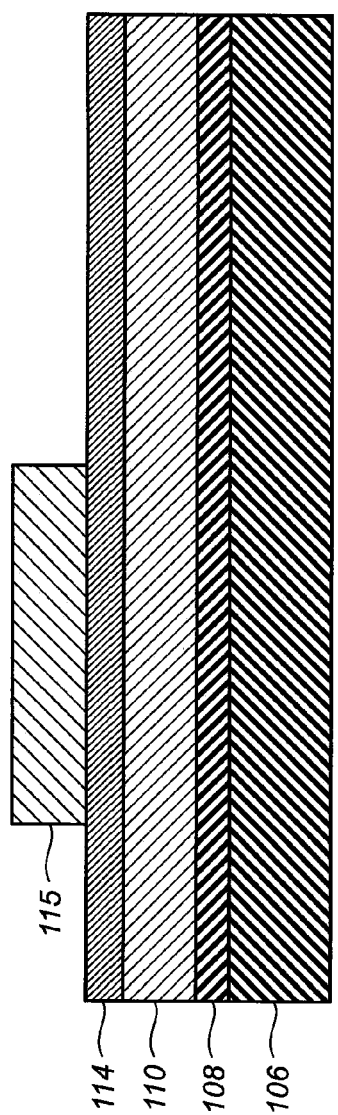

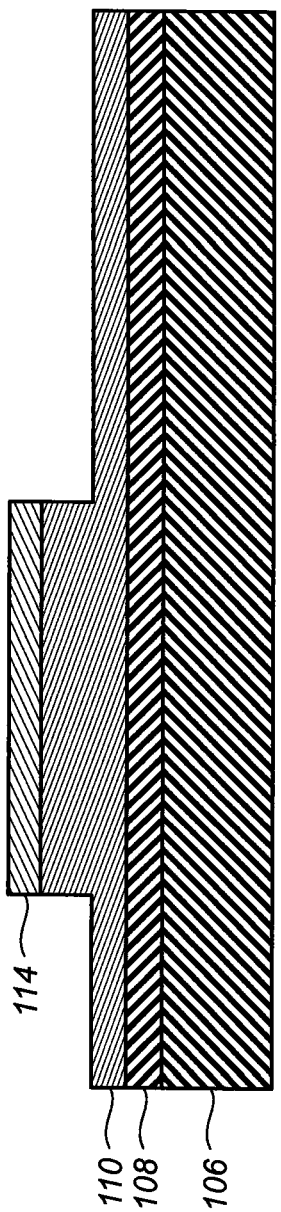
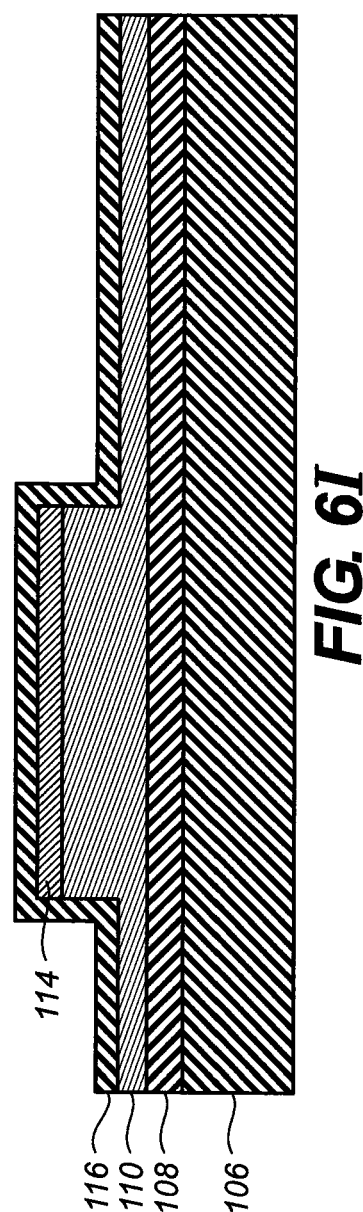
FIG. 6H
FIG. 6I

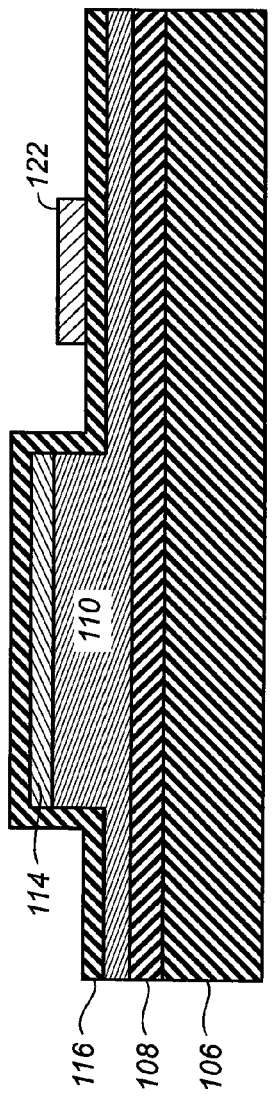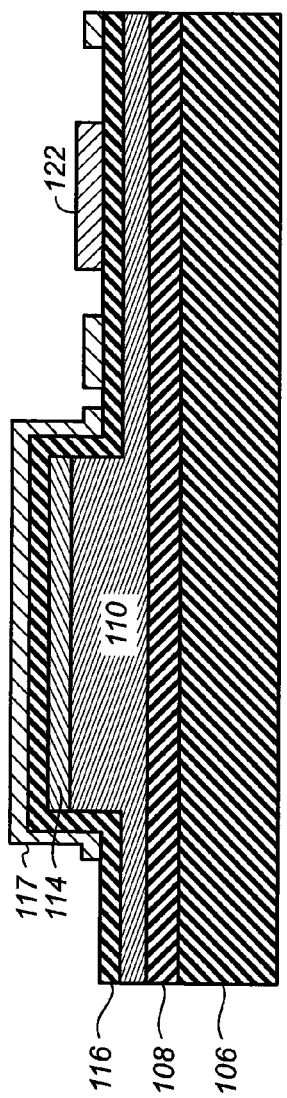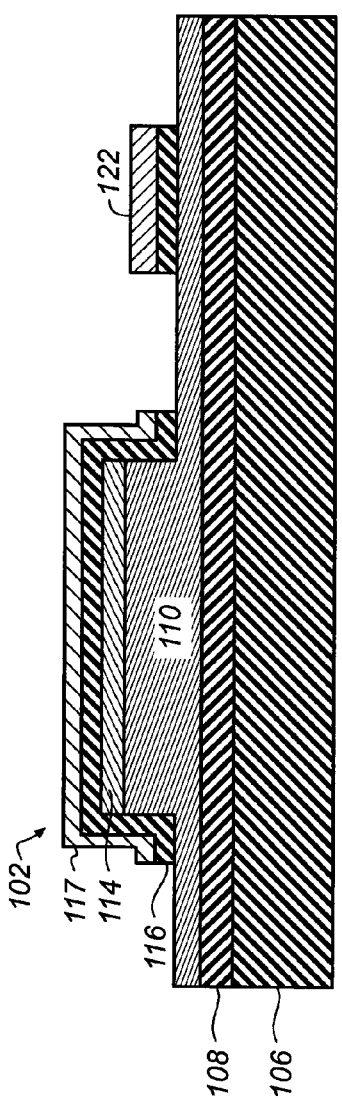

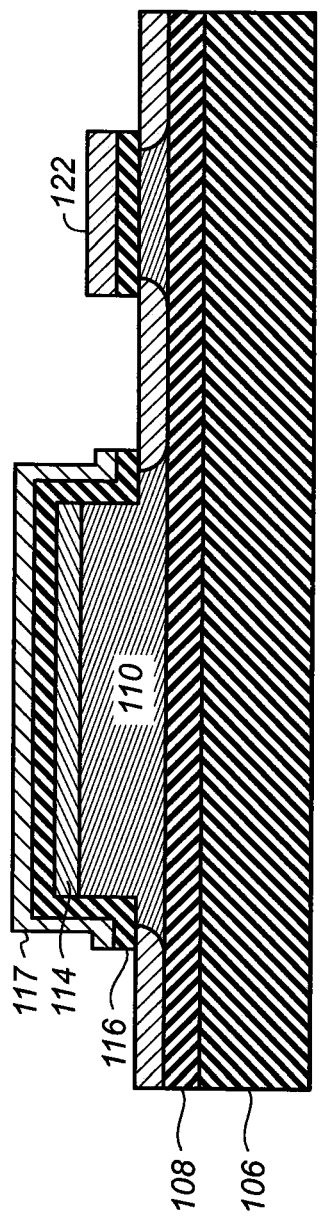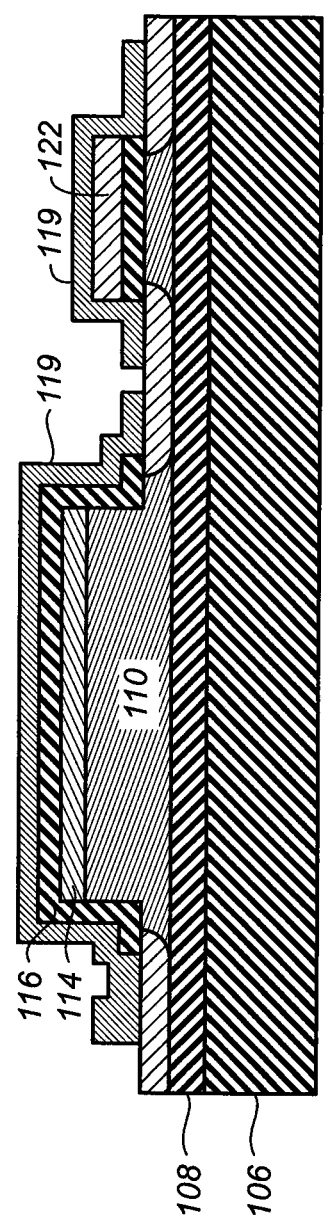

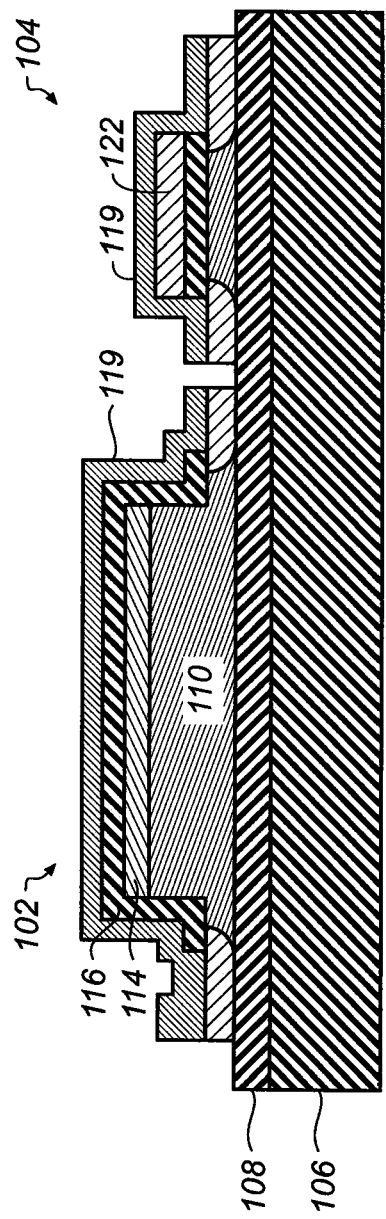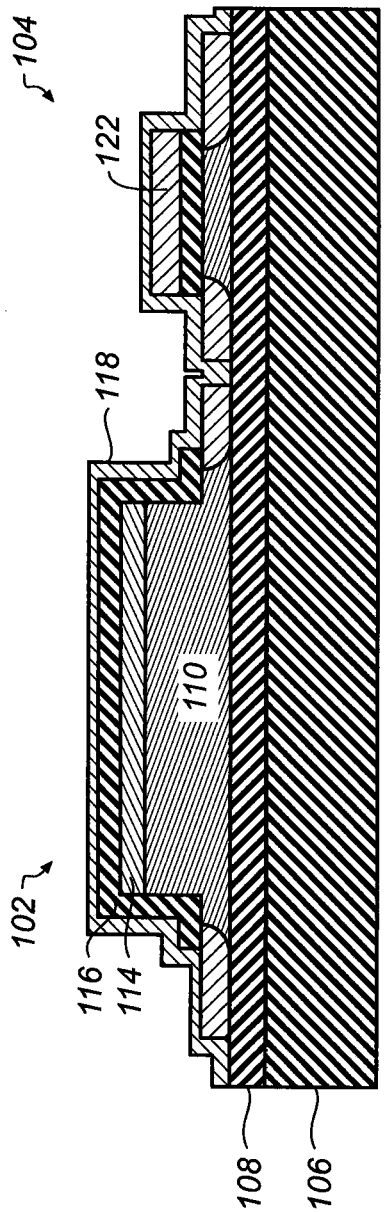

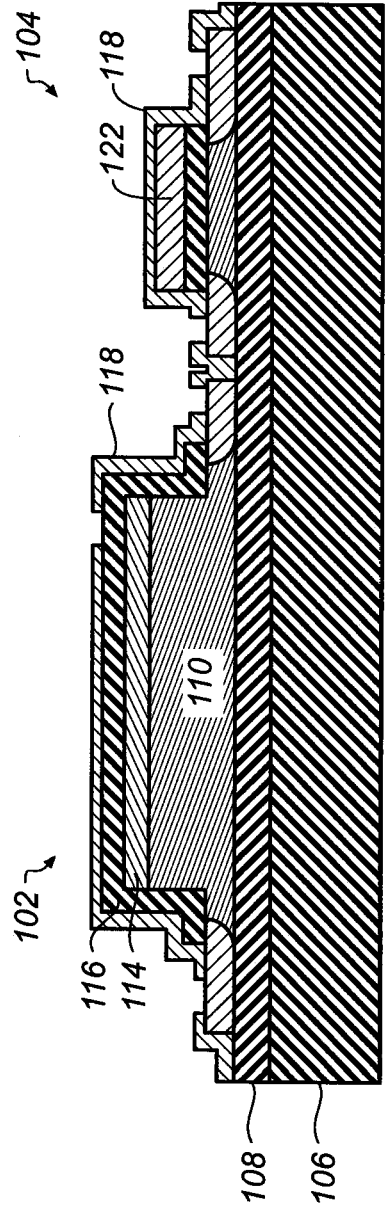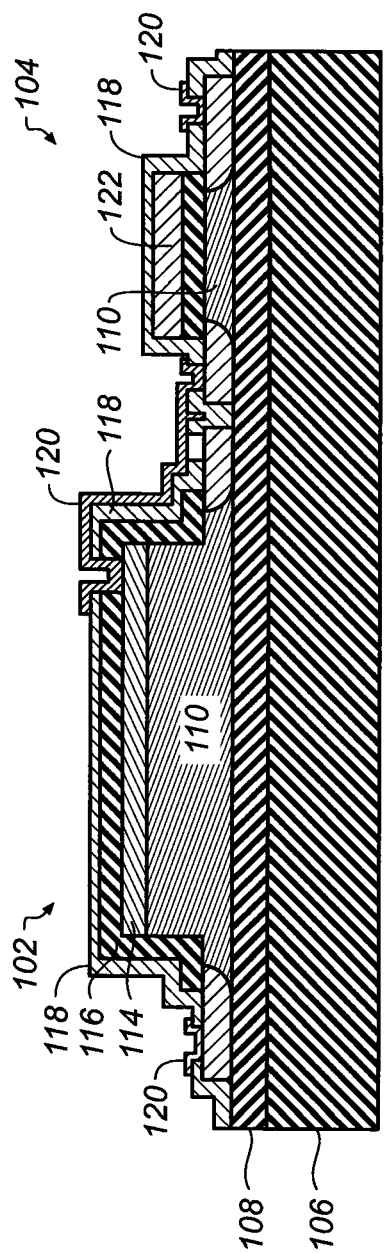

IMAGING ARRAY WITH DUAL HEIGHT SEMICONDUCTOR AND METHOD OF MAKING SAME

FIELD OF THE INVENTION

The present invention relates to imaging apparatuses. More particularly, the present invention relates to an imaging apparatus having a dual height semiconductor and methods of fabricating such an imaging apparatus.

BACKGROUND OF THE INVENTION

FIG. 1 shows a conventional 2×2 array 10 of imaging pixels 12. As illustrated, each imaging pixel 12 includes a photosensitive element 14 and a readout element 15. FIG. 1 shows an active pixel design in which the readout element includes four transistors, namely, a transfer gate 16, a reset transistor 18, a row select transistor 20, and an amplifier transistor 22. More or less transistors could be incorporated into the readout element, as is well known in the art. The photosensitive element 14 of FIG. 1 is a p-n junction photodiode, although it could be any number of photosensitive elements, including, but not limited to MIS photosensors, p-i-n photodiodes, and the like. The transistors are thin-film transistors (TFTs).

As generally known, when light strikes the array, electron-hole pairs are created. The holes diffuse through the p-type substrate to the contact on the back of the wafer. The electrons are held on the photodiode capacitance, and are selectively readout through the transfer gate 16, the amplifier transistor 22, and the row select transistor 20. Following readout, the reset transistor 18 is turned on, resetting the photodiode bias to its original value.

Imaging arrays such as those just described can be fabricated in any number of known ways. FIG. 2 illustrates a cross-section of a pixel fabricated from single crystal silicon wafers. More particularly, FIG. 2 shows a cross section taken through the photodiode 14, transfer gate 16, and amplifier transistor 22 of FIG. 1. In FIG. 2, a p-doped single crystal silicon wafer 30 is disposed on a metal contact 32. The p-n junction photodiode is formed by the p-doped substrate (p-side) and a diffusion or ion implant of phosphorous or arsenic n-type dopant (n-side) 34.

Another known imaging array uses thin-film transistors on glass. FIG. 3 illustrates a cross-section of a device in which the pixel 12 is formed in this manner. The photosensitive element 14 is an MIS photosensor and the readout element 15 is a single TFT. More transistors also could be included. In fabrication, a first level of metal 42 is deposited on a glass substrate 40. The metal 42 forms both the transistor gate for the readout element 15 and the back contact for the photosensitive element 14. A gate dielectric 44 is disposed on the metal layer 42 to form both the transistor gate dielectric and the gate dielectric for the photosensor. An undoped layer 46 thereafter is formed on the dielectric 44 to form the semiconductor layer for both the photosensitive element and the TFT. Heavily doped n-type amorphous silicon 48 forms the source and drain regions of the TFTs and the n-side contact to the MIS photosensor. Another layer of the gate dielectric thereafter preferably is disposed over the n-type amorphous silicon 48, and metal layer 50 forms the source and drain contact metallization and the vertical interconnect for the array.

In the prior art arrays just described, as in other known arrays, a silicon layer forms the semiconductor for both the photosensitive elements and the readout elements. This is a relatively low-cost fabrication method, because it minimizes fabrication steps. However, for most applications the desired thickness of the layer for imaging functions is much larger than the thickness desired for TFTs. That is, an increased thickness is desirable to absorb light, and that thickness preferably is one or more optical absorption depths. A preferred thickness typically is on the order of about one to two microns. However, thin-film-transistors fabricated from semiconductor layers that are relatively thick display significantly higher leakage currents in the off state. A preferable silicon thickness for TFTs is usually on the order of about 30-60 nm.

Differing the thickness of silicon for the imaging sensor and the TFT has been achieved in some conventional pixel designs by stacking the photosensitive element on top of the TFT. That is, the TFT first is formed on a substrate and once completed, or substantially completed, the photosensitive element is formed by subsequently formed layers. An illustration of a conventional pixel of this type is illustrated in FIG. 4. As shown, the readout element 15 is disposed beneath the photosensitive element 14.

While the vertical pixel structure of FIG. 4 allows for greater control of the thicknesses of the semiconductor layers for the photosensitive and readout elements, fabrication includes numerous steps and is therefore more expensive.

Thus, there is a need in the art for an improved manufacturing method that allows for different thicknesses of semiconductor layers in a planar imaging array. There also is a need in the art for an imaging array having semiconductor layers of different thicknesses.

SUMMARY OF THE INVENTION

The present invention remedies the foregoing needs in the art by providing an improved method of manufacturing an imaging array and an improved imaging array.

In a first aspect of the invention, a method of manufacturing an imaging array includes providing a single crystal silicon substrate and bonding the single crystal silicon substrate to an insulating substrate. One or more portions of an exposed surface of the single-crystal silicon substrate are removed to form a pattern of first areas having a first height measured from the insulating substrate and second areas having a second height measured from the insulating substrate. Photosensitive elements are formed on the first areas and readout elements are formed on the second areas.

According to a preferred method, the single-crystal silicon substrate is treated by hydrogen implantation to form an internal separation boundary and a portion of the single-crystal silicon substrate is removed at the internal separation boundary to form the exposed surface.

In another preferred embodiment, more of the exposed surface is removed to form the second areas than is removed to form the first areas. Accordingly, the single crystal silicon substrate is thicker at the locations of the photosensitive elements than at the readout elements.

The present invention also provides an improved imaging array having an insulating substrate, a single-crystal silicon substrate bonded to the insulating substrate, a plurality of photosensitive elements, and a plurality of readout elements. The single-crystal silicon substrate has a pattern of first areas and second areas. The first areas have a first height measured from the insulating substrate and the second areas have a second height measured from the insulating substrate. Each of the plurality of photosensitive elements is formed on one of the first areas. Each of the plurality of readout elements is formed on one of the second areas.

These and other aspects, objects, and features of the invention may be appreciated with reference to the accompanied detailed description of the invention and Figures, which describe and illustrate preferred embodiments of the present invention.

BRIEF DESCRIPTION OF THE DRAWINGS

The foregoing and other objects, features, and advantages of the invention will be apparent from the following more particular description of the embodiments of the invention, as illustrated in the accompanying drawings. The elements of the drawings are not necessarily to scale relative to each other.

FIGS. 6A-6R illustrate the steps of a method to fabricate the pixel structure illustrated in FIG. 5.

DETAILED DESCRIPTION OF THE INVENTION

Figure 1:
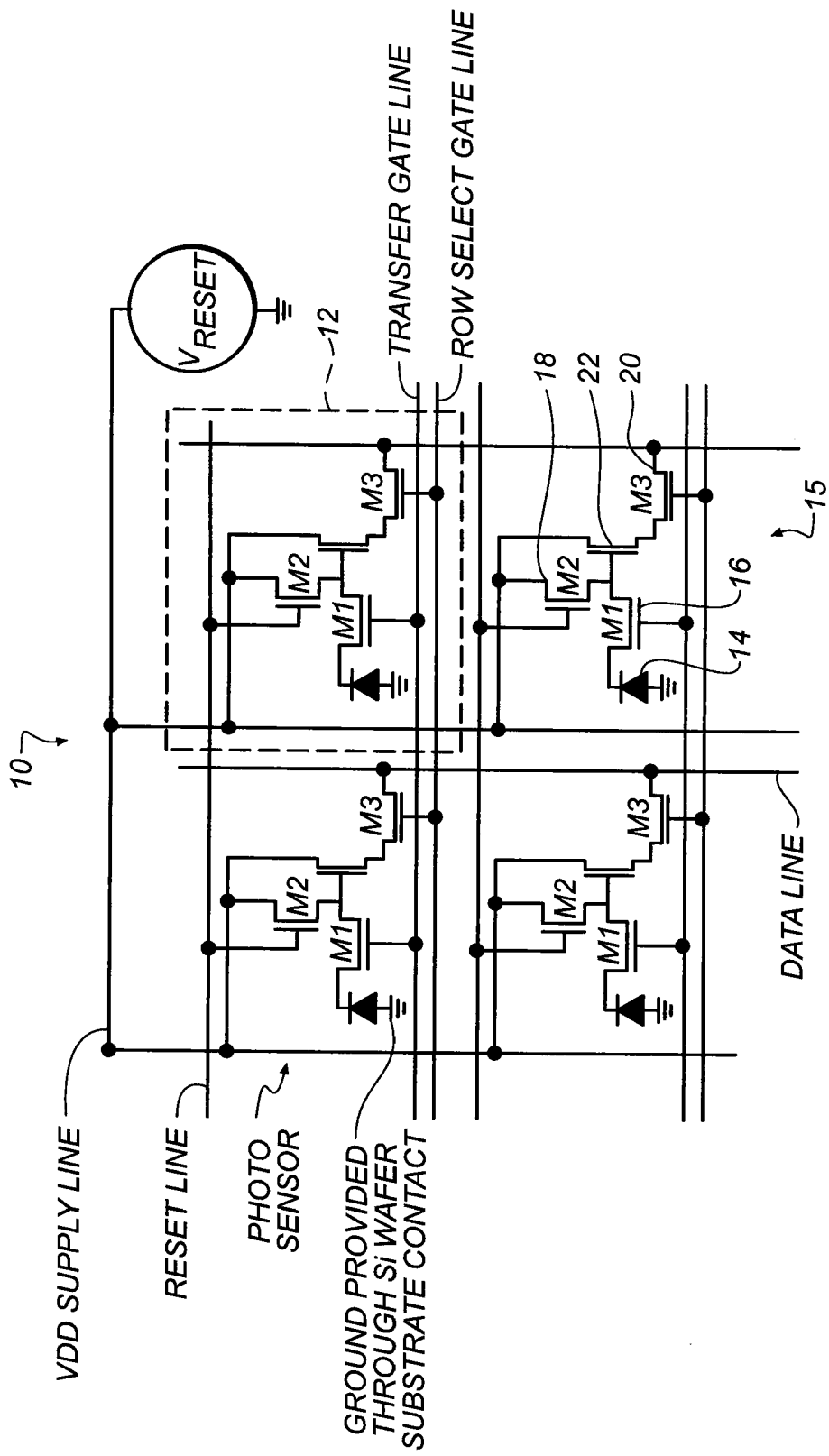
FIG. 1 is a schematic circuit diagram of a prior art imaging array including a 2×2 matrix of pixels.
Figure 2:
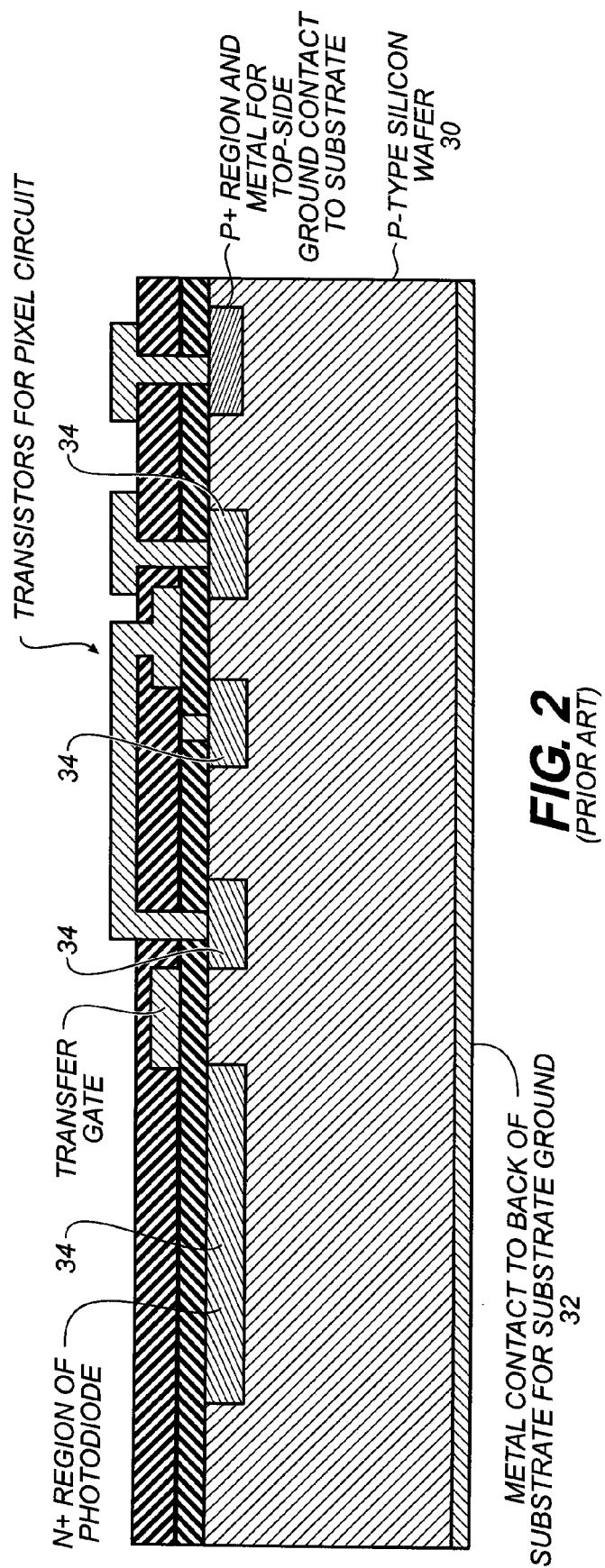
FIG. 2 is a cross-sectional elevation view of a prior art pixel used in the array illustrated schematically in FIG. 1.
Figure 3:
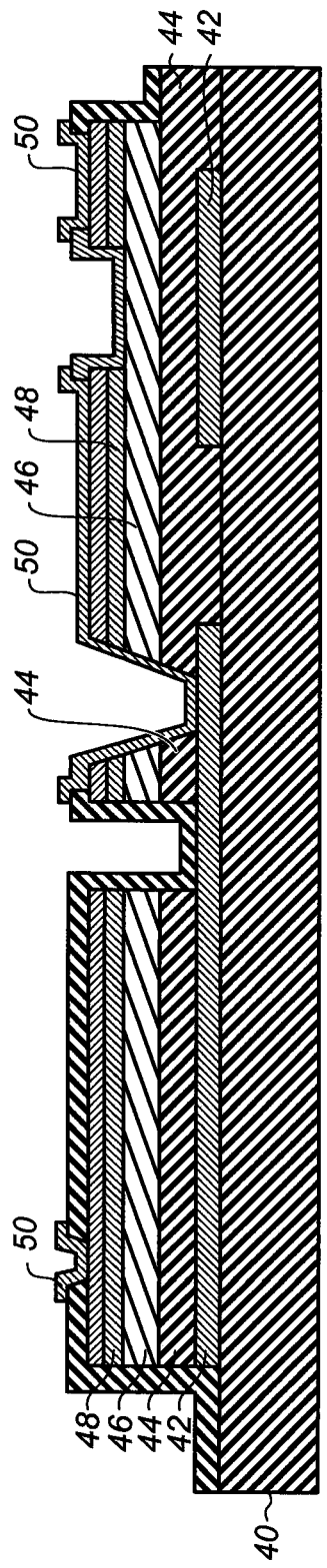
FIG. 3 is cross-sectional elevation view of another prior art pixel used in the array illustrated schematically in FIG. 1.
Figure 4:
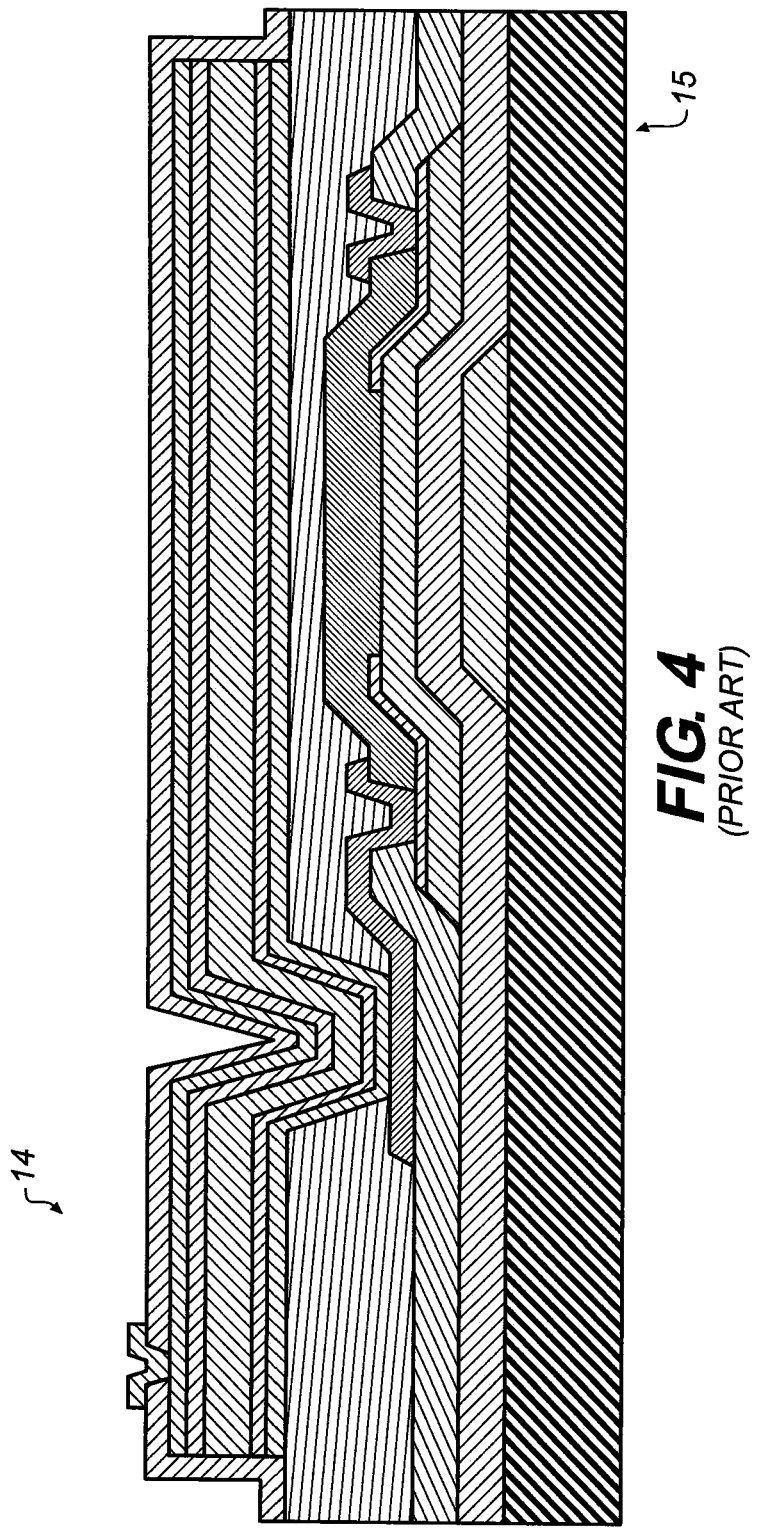
FIG. 4 is cross-sectional elevation view of another prior art pixel used in the array illustrated schematically in FIG. 1.

The following is a detailed description of the preferred embodiments of the invention, reference being made to the drawings in which the same reference numerals identify the same elements of structure in each of the several figures.

Figure 5:
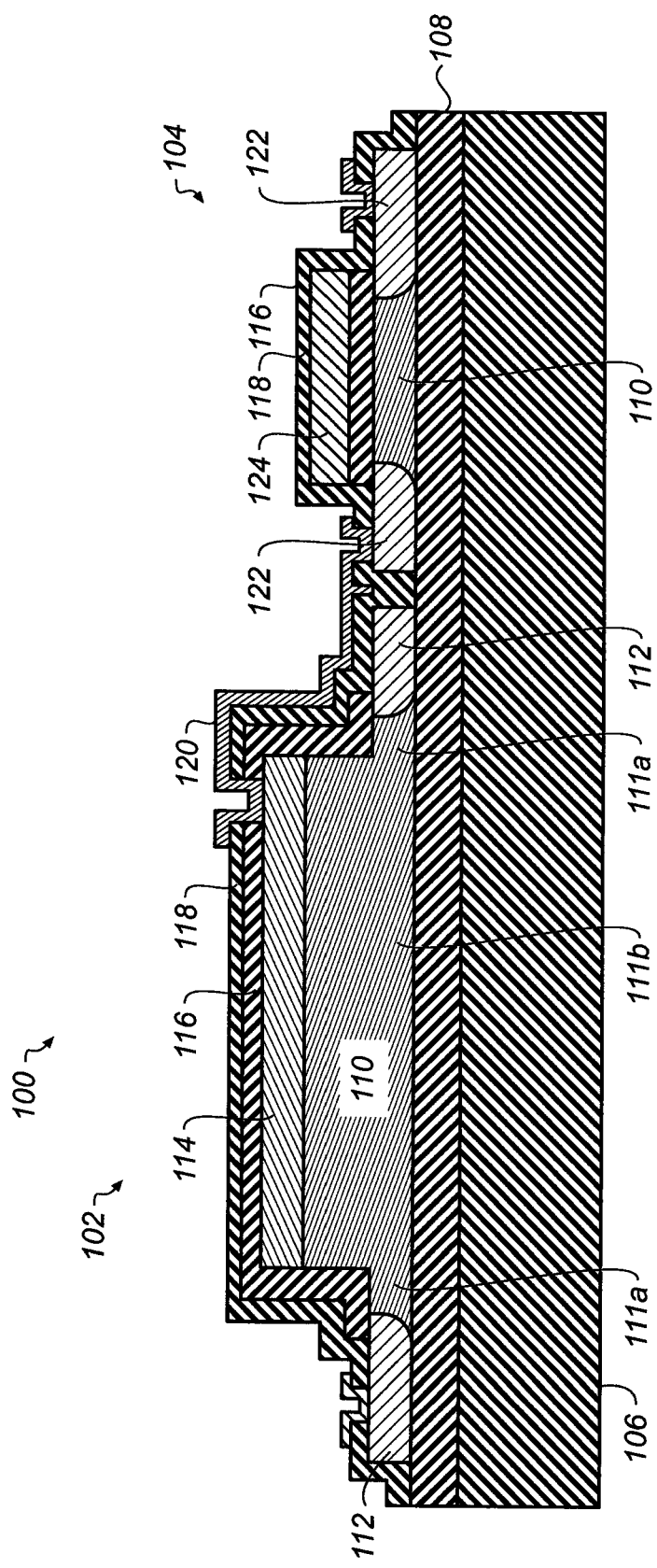
FIG. 5 is a cross-sectional elevation view of a pixel structure according to a first preferred embodiment of the invention.

A pixel 100 according to a first embodiment of the invention is illustrated in FIG. 5. The pixel 100 includes a photosensitive element 102 and a readout element 104. In this embodiment, the photosensitive element is an MIS photosensor, although, and as will be appreciated from the following description, the photosensitive element could be any number of known photosensors, including, but not limited to, p-n junction photodiodes, P-I-N photodiodes, photo-capacitors, charge-coupled devices, pinned photodiodes, phototransistors, photoconductors, avalanche photodiodes, and charge-injection devices. The readout element 104 of this embodiment is a TFT, although any number of transistors or switching diodes could be used with the invention, including, but not limited to, diode switches, CCDs, bi-polar transistors, and field effect transistors. Moreover, the readout element could include more than one transistor, for example, in the arrangement of FIG. 1.

As shown in FIG. 5, the pixel 100 includes an insulating substrate 106. Preferably, the insulating substrate 106 is a glass substrate. A lightly doped p-type single crystal silicon 110 is bonded to the glass substrate 106. A dielectric material 108, such as thermal silicon dioxide, forms the bond. The dielectric material 108 is thus disposed between the p-type silicon 110 and the glass substrate 106.

The p-type silicon layer forms semiconductive portions of both the photosensitive element 102 and the readout element 104. Notably, however, the p-type silicon layer is thicker in the photosensitive element 102 than in the readout element 104. Thus, the p-type silicon layer defines two areas, one thicker than the other. Preferably, the thickness of the p-type silicon 10 forming the photosensitive element is between about 50 nm and about 10 microns and more preferably between about 2 microns and about 5 microns. In contrast, the thickness of the p-type silicon 110 forming the readout element preferably is between about 10 nm and about 200 nm and more preferably between about 30 nm and about 50 nm.

In the embodiment of FIG. 5, the portion of the p-type silicon 110 used in the photosensitive element 102, is stepped. That is, distal edges 111a of p-type silicon 110 are relatively thinner than a central portion 111b of the p-type silicon 110. In the preferred embodiment, the distal edges 111a of the p-type silicon 10 have the same thickness as the p-type silicon 110 of the readout element 104. A portion of each of the distal edges 111a of the p-type silicon 110 is heavily doped. Each of these heavily doped portions forms a photosensitive element p-type region 112 that acts as a P+ terminal of the photosensitive element 102.

The remainder of the photosensitive element 102 consists of a heavily doped N-type region 114 formed on top of the p-type silicon 110, a gate dielectric 116 formed on the N-type region 114, and an intermetal dielectric 118 disposed on the gate dielectric and extending over the p-type regions 112 and between the photosensitive element 102 and the readout element 104. A metal layer 120 that forms the source-drain contact and the vertical interconnect is formed over the intermetal dielectric 118.

A portion of the p-type silicon 110 forming a part of the readout element 104 also is heavily doped. Specifically, edges of the p-type silicon 110 are doped to form p-type regions 122. These regions 122 form the source and drain regions for the TFT. The gate dielectric layer 116 also is disposed over the p-type silicon 110, between the p-type doped regions 122. A metal layer 124 forming the gate electrode for the TFT and the horizontal interconnect is formed over the gate dielectric layer in the TFT. The intermetal dielectric 118 also is disposed over the stacked gate dielectric layer 116 and the metal layer 124. The metal layer 120 also is formed over the p-type doped regions 122, forming the source and drain contacts, as noted above.

Accordingly, FIG. 5 illustrates a pixel 100 for use in an imaging array. The pixel 100 features a photosensitive element and a readout element arranged on the same plane, but with the photosensitive element having a semiconductor region that is thicker than the semiconductor region of the readout element. A method of fabricating the pixel of FIG. 5 now will be described with reference to FIGS. 6A-6R.

In FIG. 6A, a single crystal silicon substrate or wafer 110' is provided and through high-energy ion implantation, a layer of hydrogen 113 is implanted into the silicon substrate 110'. The depth of the hydrogen implantation preferably is substantially the same as or slightly deeper than the desired height of the central region 111b of the p-type silicon 110 forming the photosensitive element 114 in FIG. 5. The side of the wafer 110' through which the hydrogen ions were implanted is cleaned and prebonded to a glass substrate 106 as illustrated in FIG. 6B. As will be described in more detail below, the ion implantation forms an internal separation boundary.

As illustrated in FIG. 6C, the hydrogen-implanted silicon wafer 110' is anodically bonded to the glass substrate 106. The anodic bond retains the single crystal silicon wafer 110' on the glass substrate 106. Other bonding techniques, including, but not limited to, frit bonding, soldering, and adhesives could alternatively be used to bond the single crystal silicon wafer 110' to the glass substrate 106. The anodic bond preferably also forms the dielectric layer 108.

After the anodic bonding step, or as a result of this anodic bonding process, the silicon wafer 110' fractures at the depth of the ion implantation, i.e., at the internal separation boundary, as illustrated in FIG. 6D. Thus, the portion of the wafer 110' opposite the substrate 106 is removed to leave a relatively thinner amount of single crystal silicon, which is the p-type silicon 110 of FIG. 5. The surface exposed as a result of removing a portion of the silicon wafer is polished or otherwise finished, resulting in a structure such as that shown in FIG. 6E. Specifically, FIG. 6E illustrates the substrate 106 with the dielectric layer 108 and p-type single crystal silicon 110 disposed thereon.

As illustrated in FIG. 6F, the N+ silicon layer 114 is deposited on the exposed surface of the p-type silicon 110. This N-doped layer 114 preferably is formed either by ion shower doping or by ion implantation. Next, and as illustrated in FIG. 6G, a photoresist 115 is applied to the N-doped layer 114 and the structure is exposed to form a mask over the first area, which will be used for the central region 111b of the p-type silicon 110 in the photosensitive element 102.

In FIG. 6H, the n-doped layer 114 and the p-type silicon 110 are etched to thin out the silicon at areas other than the region masked in FIG. 6G. The etch preferably completely removes the N-type layer 114 and thins the p-type silicon 110 to the desired thickness for the semiconductor regions of the readout elements. The etching method may include reactive ion etching (RIE), wet etching, chemical etching, or some combination of these methods. Although etching is used in the preferred embodiment just described, other known fabrication methods could be used to form the relatively thinner p-type silicon regions. Also in FIG. 6G, the photoresist is stripped and the wafer is cleaned.

The gate dielectric layer 116 is thereafter formed over the silicon layers in FIG. 6I and a first level of metal 122 is deposited in FIG. 6J. The metal 122 forms the gate electrode for the TFT and may be used as a horizontal interconnect for the imaging array. The metal 122 may be coated with a photoresist, exposed, and etched to achieve the desired pattern, especially when the metal 122 is used as the interconnect. In the preferred embodiment, the metal 122 is aluminum, although other metals may be used, including, but not limited to, molybdenum, molybdenum tungsten, chromium, or a multilayer stack including alloying of these metals.

In FIG. 6K, another photoresist 117 is applied over the photosensitive element region, i.e., over the relatively thicker portion of the p-type silicon layer 10 having the n-type layer 114 thereon. The structure is then exposed and the dielectric is etched between the metal 122 and the photosensitive element 102, as illustrated in FIG. 6L. With the photoresist still in place, the exposed portions of the p-type silicon 110 are heavily doped with a p-type dopant, as illustrated in FIG. 6M. This doping can be performed using known methods, for example, ion shower doping or ion implantation. The photoresist 117 is thereafter stripped and the structure is cleaned of any unwanted debris.

In FIG. 6N, another photoresist 119 is applied to all but a small portion of the regions doped in the previous step. After exposure, the doped p-type silicon 110 is etched to isolate the photosensitive element 102 from the readout element 104, as shown in FIG. 6O. The photoresist 119 thereafter is removed and again any debris is cleaned. As illustrated in FIG. 6P, the intermetal dielectric 118 is thereafter deposited over the pixel. In FIG. 6Q, a portion of the intermetal dielectric 118 is removed using known etching techniques, and in FIG. 6R, the second metal layer 120 is formed to electrically connect the photosensitive element 102 and the readout element 104. The second metal layer 120 also preferably forms the vertical interconnect between pixels, and thus etching or other fabricating steps may be required to achieve the desired layout for the second metal layer 120.

Thus, FIGS. 6A-6R illustrate a method of forming the pixel shown in FIG. 5. As will be appreciated, an imaging array is formed by creating a number of pixels on the glass substrate, in the manner described. The inventive method provides a low-cost, effective way to fabricate an improved pixel in which photosensors and readout elements are disposed in the same plane, but have semiconductor regions of different thicknesses. Notably, by using silicon-on-glass technology as opposed to conventional deposition techniques, the different thicknesses are readily obtained. Moreover, the use of single crystal silicon in TFTs results in carrier mobilities over 1,000 times higher than those resulting from amorphous silicon TFTs and over 50 times higher than those of LTPS. In addition, because the single-crystal silicon contains a very low density of defects or traps, the off-state leakage current between source and drain can be very low and the off-to-on switching can be accomplished with a much smaller gate-voltage swing, allowing lower voltage operation.

Figure 7:
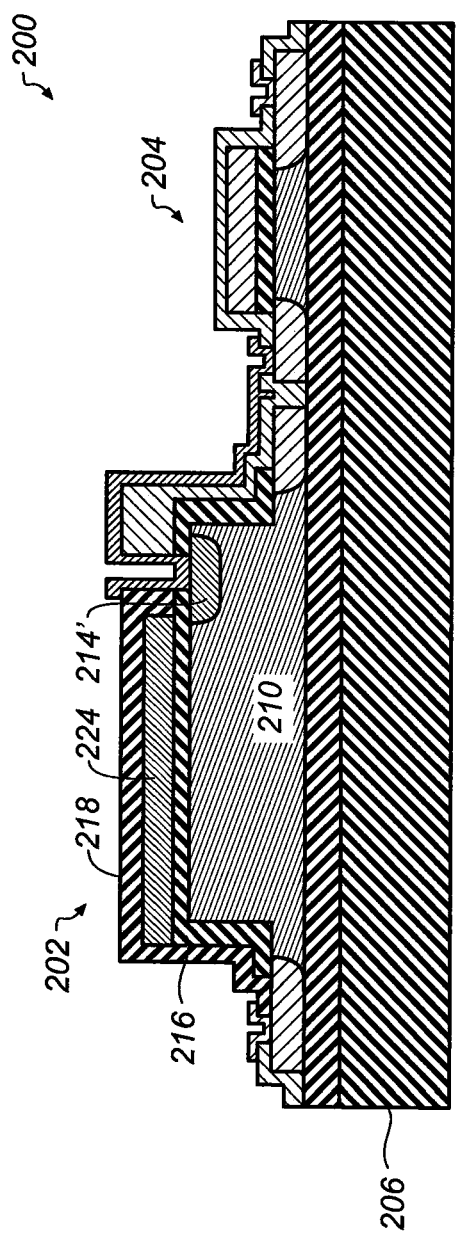
FIG. 7 is a cross-sectional elevation view of a pixel structure according to another preferred embodiment of the invention.

Other pixel structures also can be obtained using the preferred methodologies of the present invention. For example, FIG. 7 illustrates an imaging pixel 200 according to another embodiment of the invention. In FIG. 7, an MIS photosensor is used as the photosensitive element 202. The readout element 204 is again a TFT.

In the embodiment of FIG. 7, p-type silicon 210 is bonded to a glass substrate 206. However, instead of having the n-doped layer 114 of the pixel illustrated in FIG. 5, only a portion 214' of the p-type silicon 210 is n-doped, and a transparent gate electrode 224 is formed above a portion of p-type silicon 210, between a gate dielectric 216 and an intermetal dielectric 218. The remaining features of FIG. 7 are the same as those of FIG. 5, and thus are not re-described herein.

A method of fabricating the pixel of FIG. 7 would be substantially identical to fabrication of the pixel of FIG. 5, which was described in detail with reference to FIGS. 6A-6R. However, the step illustrated in 6F, namely, formation of the heavily doped N-type region, would not be needed. Instead, the doping would be localized to the smaller region 214' in that step. Alternatively, the doping of the smaller region 214' could be done in another step, later in fabrication, similar to the p-doping accomplished in the step illustrated by FIG. 6M. Another difference between the fabrication method to form the pixel of FIG. 7 and that described in FIGS. 6A-6R is that a step would be included between steps shown in FIGS. 6O and 6P in which the transparent gate electrode 224 is formed on the gate dielectric 216 using known fabrication methods. The intermetal dielectric 218 then would be formed such as in FIG. 6P, but over the transparent gate electrode 224.

Figure 8:
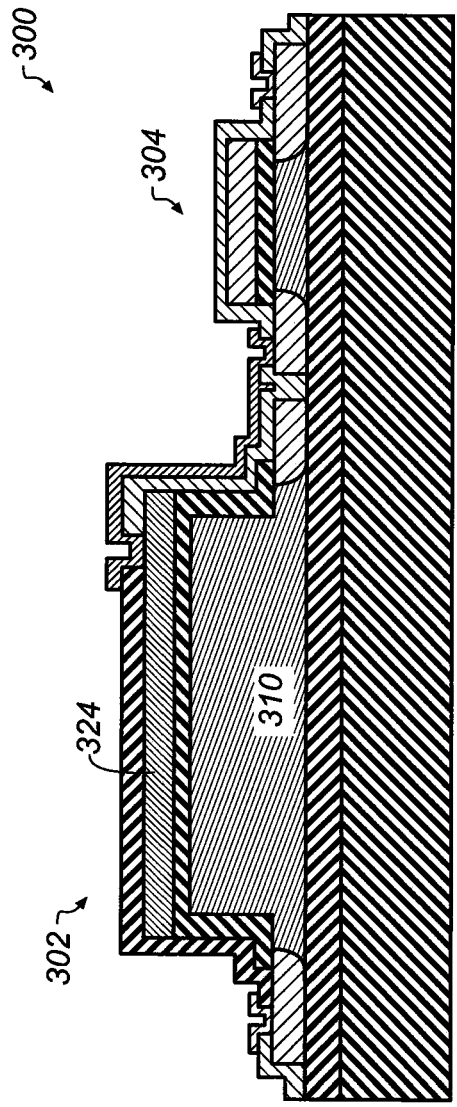
FIG. 8 is a cross-sectional elevation view of a pixel structure according to still another preferred embodiment of the invention.

Yet another embodiment of the invention is illustrated in FIG. 8. FIG. 8 shows another pixel 300 in which a photosensitive element 302 is an MIS photosensor and a readout element 304 is a TFT. Different from FIG. 7, pixel 300 does not include an n-doped region 214'. Instead, a transparent gate electrode 324 extends across p-type silicon 310 forming the semiconductor region of the photosensitive element 302. The transparent gate electrode 324 is electrically connected to readout element 304. In this embodiment, because there is no N-type diffusion contact to the inversion layer, a refresh pulse would be required to remove the electrons at the surface, following readout. Other structures of the pixel 300 are the same as those shown in FIG. 5, and will not be described in detail herein.

Fabrication of the pixel of FIG. 8 would be similar to that for the pixel of FIG. 7, especially with regard to the step(s)

required between steps shown in FIGS. 6O and 6P. Obviously, there would be no need to create an n-doped region of the p-type silicon 310 for the pixel 300.

The foregoing embodiments of the invention are representative embodiments, and are provided only for illustrative purposes. The embodiments are not intended to limit the scope of the invention. Variations and modifications are apparent from a reading of the preceding description and are included within the scope of the invention. The invention is intended to be limited only by the scope of the accompanying claims.

PARTS LIST

10. Imaging array
12. Pixel
14. Photosensitive element
15. Read out element
16. Transfer gate
18. Reset transistor
20. Row select transistor
22. Amplifier transistor
30. Single crystal silicon wafer
32. Metal contact
34. N-doped region
40. Glass substrate
42. First level of metal
44. Gate dielectric
46. Undoped layer
48. Heavily doped N-type amorphous silicon
50. Metal layer
100. Pixel
102. Photosensitive element
104. Readout element
106. Insulating substrate
108. Dielectric material
110. P-type silicon
110'. Single crystal silicon substrate
111a. Distal edges of silicon
111b. Central portion of silicon
112. Photosensitive element P-type region
113. Hydrogen
114. Heavily doped N-type region
115. Photoresist
116. Gate dielectric
117. Photoresist
118. Intermetal dielectric
119. Photoresist
120. Metal layer
122. P-Type region
124. Metal Layer
200. Imaging pixel
202. Photosensitive element
204. Readout element
206. Glass substrate
210. P-Type silicon
214'. N-doped silicon
216. Gate dielectric
218. Intermetal dielectric
224. Transparent gate electrode
300. Pixel
302. Photosensitive element
304. Readout element
310. P-type silicon
324. Transparent gate electrode

The invention claimed is:

1. An imaging array comprising:
   an insulating substrate;
   a plurality of pixels arranged in row and columns, each pixel including a photosensitive element and at least one readout element, where the photosensitive element and at least one readout element are co-planar;
   a thin single-crystal silicon substrate bonded to the insulating substrate, the thin single-crystal silicon substrate configured to form semiconductive portions of both the photosensitive element and the at least one readout element in the plurality of pixels, where the thin single-crystal silicon substrate is thicker in the photosensitive element than in the at least one readout element, said semiconductive portions of thin single-crystal silicon substrate in the photosensitive elements having a first height measured from the insulating substrate and the semiconductive portions of thin single-crystal silicon substrate in the at least one readout elements having a second height measured from the insulating substrate, where the first height is different than the second height; and
   a bonding dielectric layer to secure the insulating substrate to the single-crystal silicon substrate.

2. The imaging array of claim 1, wherein the photosensitive element is at least one of a p-n junction photodiode, a PIN junction photodiode, an MIS sensor, a pinned photodiode, a CCD, an avalanche photodiode, a photo-transistor, and a charge injection device.

3. The imaging array of claim 1, wherein the readout element comprises at least one of a transistor, a diode switch, a CCD, a bi-polar transistor, and a field effect transistor.

4. The imaging array of claim 1, wherein the first height is between about 50 nm and about 10 microns.

5. The imaging array of claim 4, wherein the first height is between about 2 microns and about 5 microns.

6. The imaging array of claim 1, wherein the second height is between about 10 nm and about 200 nm.

7. The imaging array of claim 6, wherein the second height is between about 30 nm and about 50 nm.

8. The imaging array of claim 1, wherein the first height is greater than the second height.

9. The imaging array of claim 1, wherein the insulating substrate is a glass substrate.

10. The imaging array of claim 8, wherein one or more portions of an exposed surface of the single-crystal silicon substrate opposite the insulating substrate are removed to form the pattern of the second areas having the second height less than the first height measured from the insulating substrate.

11. The imaging array of claim 1, where the single-crystal silicon substrate forms semiconductive portions of the plurality of photosensitive elements and the plurality of readout elements, where the single-crystal silicon substrate is thicker in the plurality of photosensitive elements than the plurality of readout elements.

12. The imaging array of claim 11, where the semiconductive portions of the single-crystal silicon substrate at the plurality of readout elements includes highly doped regions that form first and second electrodes of at least one readout transistor.

13. The imaging array of claim 11, where the semiconductive portions of the single-crystal silicon substrate at the plurality of photosensitive elements form a highly doped N-type region and a highly doped P-type region in each of the plurality of photosensitive elements.

14. The imaging array of claim 11, where the semiconductive portions of the single-crystal silicon substrate at the plurality of photosensitive elements form at least one highly doped region in each of the plurality of photosensitive elements.

15. The imaging array of claim 11, where the semiconductive portions of the single-crystal silicon substrate in the plurality of photosensitive elements are stepped with distal edges thinner than a central portion of the single-crystal silicon in the plurality of photosensitive elements.

16. The imaging array of claim 1, where a portion of the single-crystal silicon substrate is in each of the plurality of photosensitive elements and another portion of the single-crystal silicon substrate is in each the plurality of readout elements.

17. An imaging array comprising:
a silicon-on-glass technology substrate comprising,
   an insulating substrate;
   a single-crystal silicon substrate; and
   a bonding dielectric layer to adhere the single-crystal silicon substrate to the insulating substrate,
a plurality of pixels arranged in row and columns, each pixel including a photosensitive element and at least one readout element, where the photosensitive element and at least one readout element are co-planar in the single-crystal silicon substrate, where the single-crystal silicon substrate is configured to form semiconductive portions of both the photosensitive element and the at least one readout element in said each pixel, where the single-crystal silicon substrate is thicker in the semiconductive portions of the photosensitive element than in the semiconductive portions of the at least one readout element, said semiconductive portions of single-crystal silicon substrate in the photosensitive elements having a first height measured from the insulating substrate and the semiconductive portions of single-crystal silicon substrate in the at least one readout elements having a second height measured from the insulating substrate, where the first height is different than the second height;
the plurality of photosensitive elements, each are configured to include an additional layer; and
the plurality of readout elements, each are configured to include an additional layer.

18. An imaging array comprising:
an insulating substrate;
a single-crystal silicon substrate bonded to the insulating substrate, the single-crystal silicon substrate having a pattern of pixels, each pixel including a photosensitive element at first areas and at least one readout element at second areas, the first areas having a first height measured from the insulating substrate and the second areas having a second height measured from the insulating substrate, where the first height is different than the second height;
a bonding dielectric layer between the insulating substrate and the single-crystal silicon substrate,
where the single-crystal silicon substrate forms semiconductive portions of the plurality of photosensitive elements and the plurality of readout elements, where the single-crystal silicon substrate is thicker in the plurality of photosensitive elements than the plurality of readout elements, and where the semiconductive portions of the single-crystal silicon substrate in the plurality of photosensitive elements are stepped with distal edges thinner than a central portion of the single-crystal silicon in the plurality of photosensitive elements.

\* \* \* \* \*